United States Patent [19]
Gent et al.

[11] 3,999,102
[45] Dec. 21, 1976

[54] LINE DEFLECTION CIRCUIT ARRANGEMENT

[75] Inventors: Derek James Gent, Carshalton; Dennis Charles Frederick Skelton, Wallington, both of England

[73] Assignee: U.S. Philips Corporation, New York, N.Y.

[22] Filed: Mar. 24, 1975

[21] Appl. No.: 561,414

[30] Foreign Application Priority Data
Apr. 1, 1974 United Kingdom ............ 14380/74

[52] U.S. Cl. ............................... 315/410; 315/408
[51] Int. Cl.² ........................................ H01J 29/74
[58] Field of Search .......... 315/397, 408, 409, 410

[56] References Cited
UNITED STATES PATENTS
3,838,312   9/1974   Jordan ............................... 315/410
3,887,842   6/1975   Owens, Jr. et al. ................. 315/397

Primary Examiner—T.H. Tubbesing
Assistant Examiner—T. M. Blum
Attorney, Agent, or Firm—Frank R. Trifari; Henry I. Steckler

[57] ABSTRACT

A circuit is a combination of a switched mode power supply and a TV deflection circuit. It features a pair of switches and a pair of inductors that are tuned to selected frequencies so that when the switches are off, the inductor voltages have a half sine wave shape.

22 Claims, 18 Drawing Figures

LINE DEFLECTION CIRCUIT ARRANGEMENT

The invention relates to circuit arrangements which includes a switched mode power supply and in particular relates to such arrangements which may be used in television display apparatus.

Such power supplies have been used in television display apparatus either discreetly or in an arrangement which combines the functions of the switched mode power supply and a line deflection circuit. In either case it has been usual to switch the supply at line frequency.

The invention provides a circuit arrangement for television display apparatus including a switched mode power supply circuit and a line deflection circuit said arrangement comprising a first switch connected in series with a first inductor tuned to a first predetermined frequency between terminals adapted to be connected to a source of direct voltage, a second switch connected in series with a second inductor tuned to a second predetermined frequency said second predetermined frequency being such that the period of a half sinewave is equal to the flyback period, a capacitor, and a deflection coil, wherein said first switch is adapted to be switched at line frequency or a multiple or submultiple thereof to produce a charge on said capacitor, said capacitor when charged acting as a direct voltage supply for said second switch, and said second switch is adapted to be driven at line frequency to provide a current to said deflection coil during the scan period.

The first and second inductors may be inductively coupled whilst in operation, current may be induced in said second inductor by current flowing in said first inductor, said induced current being effective to charge said capacitor. In such an arrangement said terminals may be adapted to be connected to a source of rectified mains voltage, and said switched mode power supply circuit may be adapted to produce a source of direct voltage for said line deflection circuit said source of direct voltage being isolated from said mains voltage.

The circuit arrangement may include means for varying the time at which said first switch is switched off relative to that at which said second switch is switched off, said means being controlled by a potential present in or derived from said circuit arrangement.

When the inductors are inductively coupled the circuit arrangement may further comprise a first pulse generator for producing a first switching signal at line frequency, said first pulse generator being adapted to be controlled by a synchronising signal, means for applying said first switching signal to said second switch to control the switching thereof, means for applying said first switching signal to a pulse width modulator, said pulse width modulator being adapted to produce a second switching signal at line frequency whose pulse width is dependent on a voltage produced in or derived from said circuit arrangement, the leading edge of each pulse of said second switching signal substantially coinciding with that of said first switching signal, means for applying said second switching signal to a second pulse generator, said second pulse generator being adapted to produce a third switching signal at line frequency, said third signal comprising pulses having a substantially constant pulse width, the leading edge of each pulse of said third signal being substantially co-incident with the trailing edge of the corresponding pulse of said second signal, and means for applying said third signal to said first switch to control the switching thereof. The second signal in such a case may be applied to said second pulse generator through a transformer, said transformer being effective to maintain isolation between said source of direct voltage and said means voltage.

The invention also provides a line deflection circuit arrangement for television display apparatus comprising a switched mode power supply circuit adapted to be switched at line frequency and including a first inductor tuned to a first predetermined frequency, a second inductor tuned to a second predetermined frequency, said second predetermined frequency being such that the period of a half sinewave thereof is equal to the flyback period, said second inductor being inductively coupled to said first inductor, and a deflection coil, the arrangement being such that, in operation, part of the current through the deflection coil during at least part of the scan period is provided by current induced in said second inductor by current flowing in said first inductor.

The invention further provides a line deflection circuit arrangement comprising a first switch connected in series with a first inductor tuned to a first predetermined frequency between terminals adapted to be connected to a source of direct voltage, a second switch connected in series with a second inductor tuned to a second predetermined frequency said second predetermined frequency being such that the period of a half sinewave is equal to the flyback period, a capacitor, and a deflection coil, wherein said first switch is adapted to be switched at line frequency or a multiple or submultiple thereof to produce a charge on said capacitor, said capacitor when charged acting as a direct voltage supply for said second switch, said second transistor is adapted to be driven at line frequency to provide a current to said deflection coil during the scan period, and said first and second inductors are inductively coupled so that current induced in said inductor by current flowing in said first inductor provides at least part of the current through said deflection coil during at least part of the scan period.

The second inductor may be connected between a first pole of said first switch and the second pole of said second switch, said capacitor being connected between the first poles of said first and second switches. Alternatively, said second inductor may be connected between the second pole of said second switch and one end of said capacitor, the other end of said capacitor being connected to a terminal adapted to be connected to said source of direct voltage.

The said terminals may be adapted to be connected to a source of rectified mains voltage and said second inductor is isolated from said source of rectified mains voltage, said capacitor being connected across the series arrangement of said second switch and said second inductor. Means may be provided for varying the time at which said first switch is switched off relative to that at which said second switch is switched off, said means being controlled by a potential present in or derived from said circuit arrangement.

In a modification of the above line deflection circuit arrangement said first and second inductors need not be inductively coupled.

Embodiments of the invention will now be described, by way of example, with reference to the accompanying drawings in which.

Figure 1:
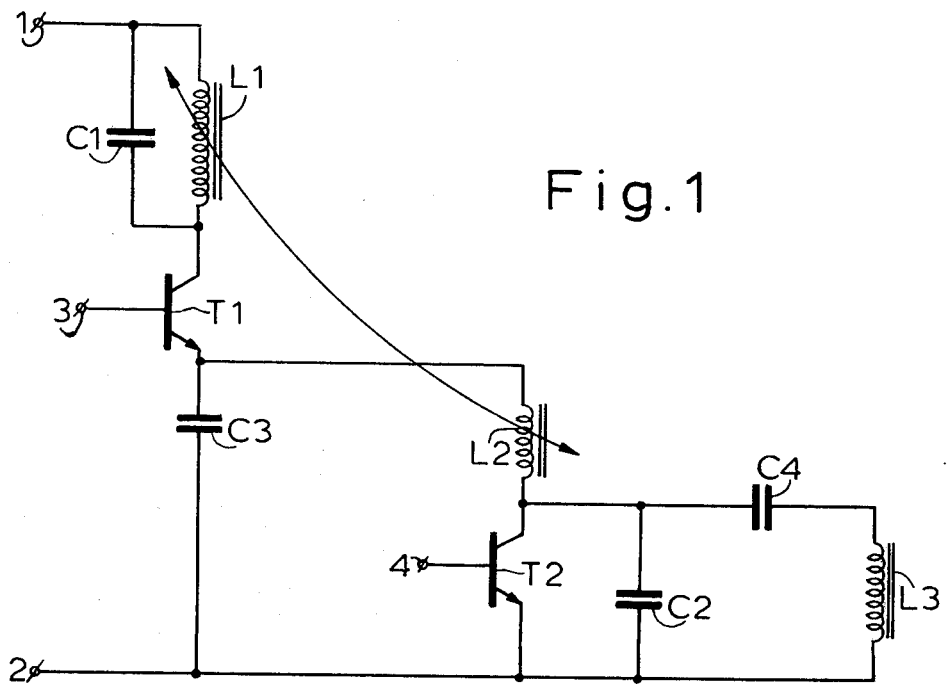
FIG. 1 shows a first embodiment of a circuit arrangement according to the invention.

In the embodiment shown in FIG. 1 the parallel arrangement of an inductor L1 and a capacitor C1 is connected in series with the collector-emitter path of an n.p.n. transistor T1 and a capacitor C3 across two terminals 1 and 2. The series arrangement of an inductor L2, which is inductively coupled with inductor L1 and the collector-emitter path of an n.p.n. transistor T2 is connected between the junction of the emitter of transistor T1 and capacitor C3 and terminal 2. The junction of inductor L2 and the collector of transistor T2 is connected to the junction of a capacitor C2 whose other end is connected to terminal 2 and a capacitor C4 whose other end is connected to one end of a deflection coil L3 whose other end is connected to terminal 2. The base electrodes of transistors T1 and T2 are connected to terminals 3 and 4 respectively.

In operation rectified and smoothed mains voltage is applied between terminals 1 and 2. Transistor T1 is switched at line frequency by pulses applied through terminal 3 to the base of that transistor and the current flowing through the transistor, which applies a net charge to capacitor C3, has the waveform shown in FIG. 3 as waveform $I_{T1}$. The switching frequency for transistor T1 could alternatively be a multiple or submultiple of the line frequency. Transistor T1 is switched such that it is cut off during the line flyback period but is in its low impedance state during the line scan period during which period current can flow in either direction through the transistor as can be seen from waveform $I_{T1}$. If the transistor is not capable of allowing current to flow through it in both directions then it will be necessary to provide a correctly poled diode in parallel with the transistor's main current path (emitter-collector). The voltage at the collector of transistor T1 has the waveform shown as waveform $V_{C(T1)}$, the voltage pulses being of half sinewave form their frequency being mainly determined by the tuning of the collector circuit of transistor T1 which comprises inductor L1, capacitor C1 and the reflected impedance of inductor L2, deflection coil L3 and capacitor C2. The voltage $V_{C3}$, which is the voltage across capacitor C3, is lower than the input voltage $V_{IP}$, applied to terminals 1 and 2 by an amount such that the area A under the voltage pulse is equal to the area B between successive voltage pulses. Thus in order to maintain a given voltage across capacitor C3 with a given flyback time ($T_{fb}$) a given pulse height is required.

Transistor T1 together with inductor L1, capacitor C1 and capacitor C3 form a switched mode power supply the output of which is available across capacitor C3. By tuning the inductor L1 with the capacitor C1 it can be arranged that the magnitude of the voltage pulse produced across inductor L1 when transistor T1 is switched off is reduced compared with that which would have occurred if capacitor C1 was absent. This enables a transistor having a lower collector-emitter breakdown voltage to be used than would otherwise be possible.

The charge on capacitor C3 serves as the power supply for a deflection stage formed by transistor T2 and its associated components and the value of capacitor C3 should be chosen so that it is low enough to restrict the amplitude of currents produced by flashover in a cathode ray display tube and large enough to cause a relatively low voltage ripple in the supply to the deflection stage which may be of conventional design.

Figure 3:
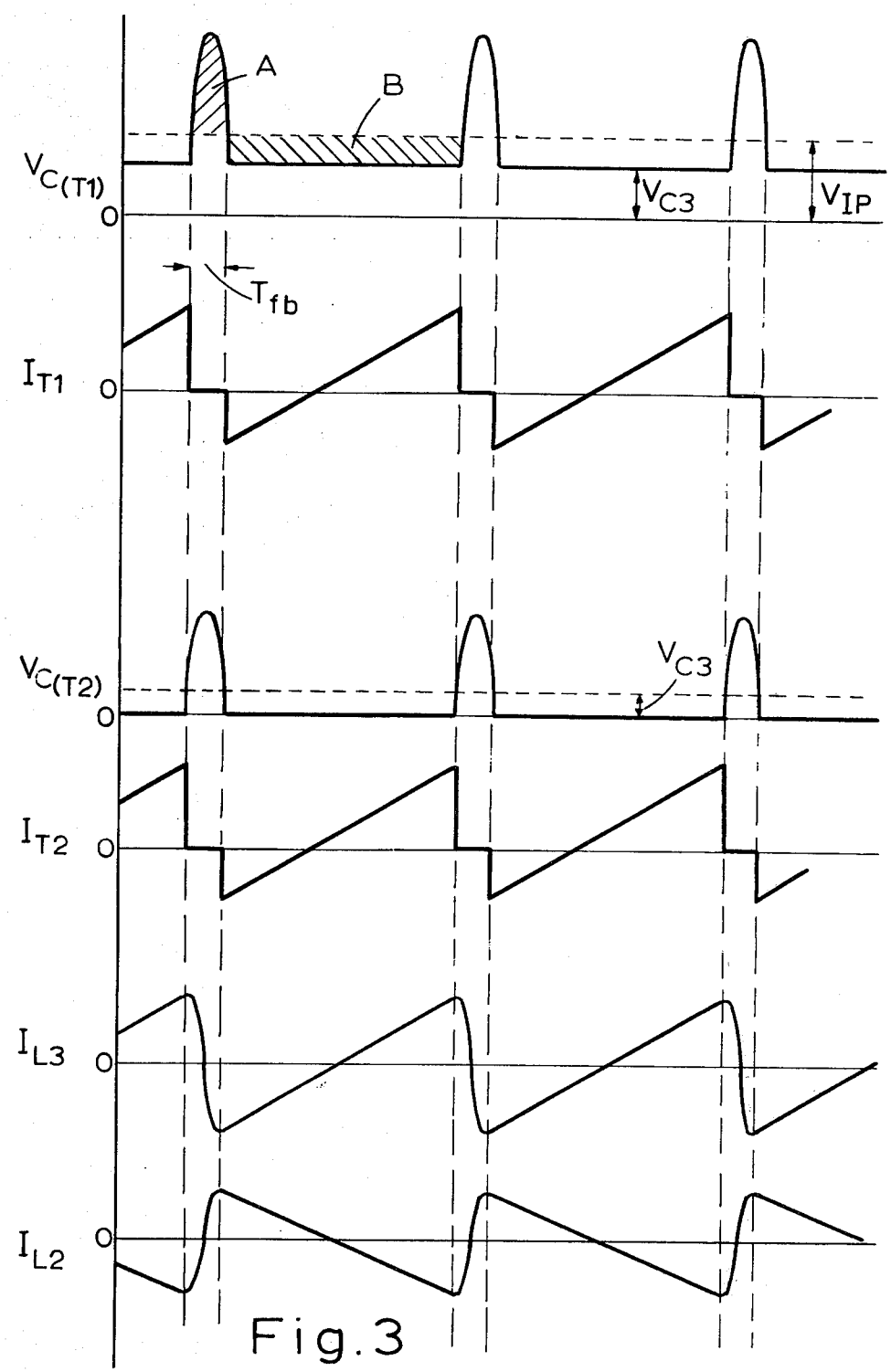
FIG. 3 shows current and voltage waveforms in the circuit arrangement shown in FIG. 1 when operating under a first set of conditions.

Transistor T2 is also switched at line frequency by pulses applied through terminal 4 to the base of that transistor and drives the deflection coil L3, the waveform appearing at its collector being shown as waveform $V_{C(T2)}$ in FIG. 3, the dotted line on this waveform showing the voltage $V_{C3}$ to which capacitor C3 becomes charged. The value of capacitor C2 is chosen so that the resonant frequency of the collector circuit of transistor T2 which comprises capacitor C2, inductor L2, deflection coil L3, and the reflected impedance of capacitor C1 and inductor L1 produces a half sinewave pulse having a period equal to the flyback period. The currents $I_{T2}$, $I_{L2}$, and $I_{L3}$ flowing through transistor T2, inductor L2, and inductor L3 respectively are shown in FIG. 3. From current $I_{T2}$ it will be seen that transistor T2 when its low impedance state has currents passing through it in both directions as was the case with transistor T1. As with transistor T1, if transistor T2 is not capable of conducting current in both directions a suitably poled diode will be provided in parallel with its main current path. Part of the current in inductor L2 is that induced by the current flowing in inductor L1 and provides part of the current flowing through the deflection coil L3 thus reducing the current transistor T2 is required to pass. In the optimum case it is theoretically possible to reduce the current through transistor T2 to half the value which would occur if there was no inductive coupling between inductors L1 and L2.

By correctly choosing the inductances of inductors L1 and L2, the turns ratio, and the degree of coupling between them it is possible to make the currents carried by transistors T1 and T2 substantially equal. To produce the waveforms shown in FIG. 3 transistors T1 and T2 are driven such that they are switched at the same time and for the same period and the tuned circuit forming the collector circuit of transistor T1 has the same resonant frequency as that forming the collector circuit of transistor T2. In this case the inductors L1 and L2 may be tightly coupled. By the term "tightly coupled" is meant the degree of coupling between the two inductors such that the voltage induced in the second inductor (L2) has across it substantially the same voltage waveform as that existing across the first inductor (L1) when the second inductor is not loaded. If the inductors L1 and L2 are loosely coupled then they may be wound on opposite limbs of the line output transformer.

Figure 4:
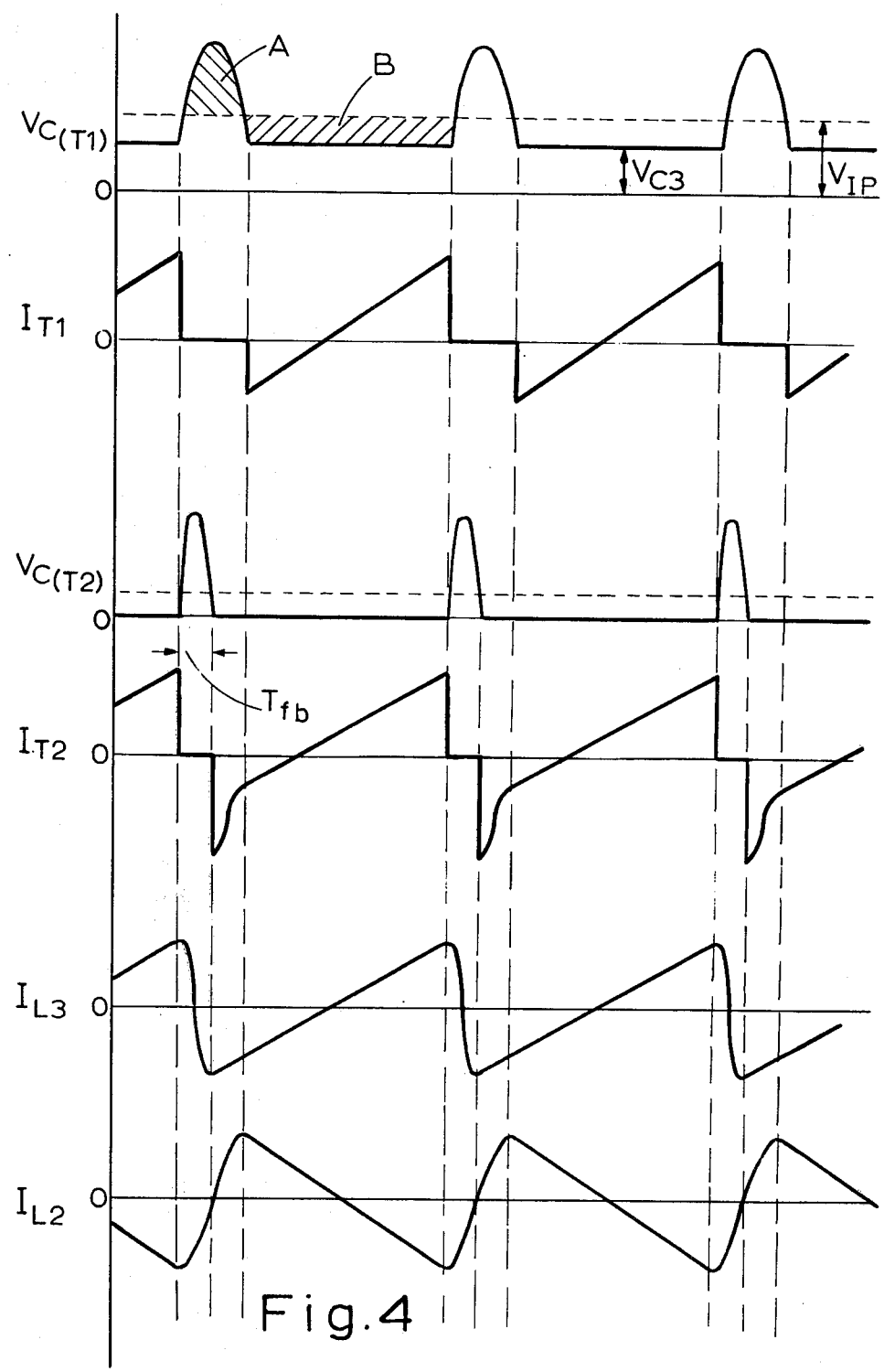
FIG. 4 shows current and voltage waveforms in the circuit arrangement shown in FIG. 1 when operating under a second set of conditions.

If the inductors L1 and L2 are loosely coupled then the collector circuit of transistor T1 may be tuned to a different frequency from the collector circuit of transistor T2 and therefore switched at or for different times. The collector circuit of transistor T2 is turned to the flyback frequency of the line deflection circuit which is fixed for any given television transmission system. When the collector circuit of transistor T1 is tuned to a different frequency which gives a pulse which is longer than the flyback time the amplitude of the voltage pulse at the collector of transistor T1 will be lower for a given charge on capacitor C3. This gives the advantage that transistor T1 does not have to withstand such a high voltage across it and hence may be a lower rated and therefore less expensive device. If the collector circuit of transistor T1 is tuned to a lower frequency than that of the collector circuit of transistor T2 than transistor T2 has to provide a higher current for part of the scan period, as shown in waveform $I_{T2}$ in FIG. 7. However, the current required from transistor T2 is reduced for that part of the scan period during which transistor T1 conducts. FIG. 4 shows the equivalent waveforms to those shown in FIG. 3 when circuit conditions are such that the voltage pulse produced across inductor L1 is longer than the flyback period and transistors T1 and T2 are switched off at the same time.

Figure 2:
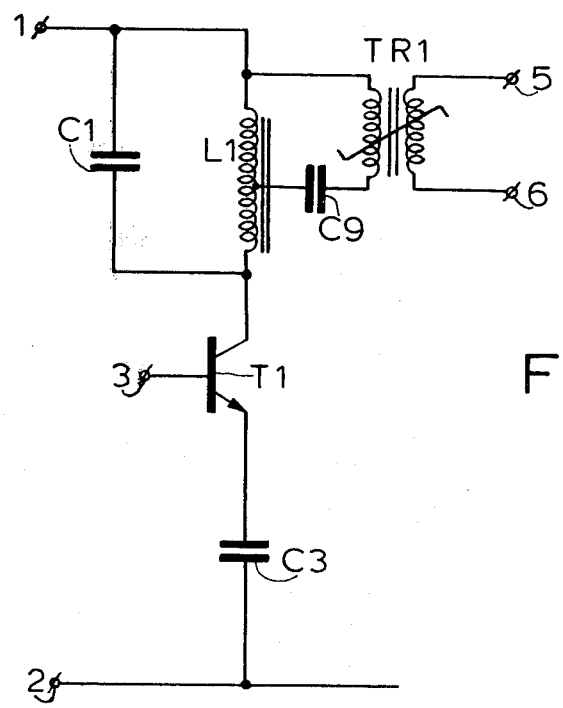
FIG. 2 shows a modification of part of the circuit arrangement shown in FIG. 1.

It is possible to modify the arrangement when inductors L1 and L2 are loosely coupled so that stabilisation of the supply voltage to the deflection stage against variations of the supply voltage applied to terminals 1 and 2 is produced. This may be achieved as shown in FIG. 2 by connecting the secondary winding of a transductor TR1 in parallel with inductor L1 and applying to the control winding of the transductor via terminals 5 and 6 a control voltage which is dependent on the value of the supply voltage to the deflection stage. The capacitor C9 in series with the secondary winding of the transductor is present to prevent direct currents flowing in the secondary winding of the transductor thus affecting its inductance and any component which will perform this function could be substituted for this capacitor. Variations in this control voltage will cause corresponding variations in the inductance of its secondary winding which partially shunts inductor L1. This will cause the frequency of the tuned circuit and hence the collector voltage pulse width to vary and thus vary the proportion of the supply voltage to which the capacitor C3 is charged. In a modification of FIG. 2 the secondary winding of transductor TR1 could be placed in series with inductor L1, capacitor C9 not being required.

Figure 5:
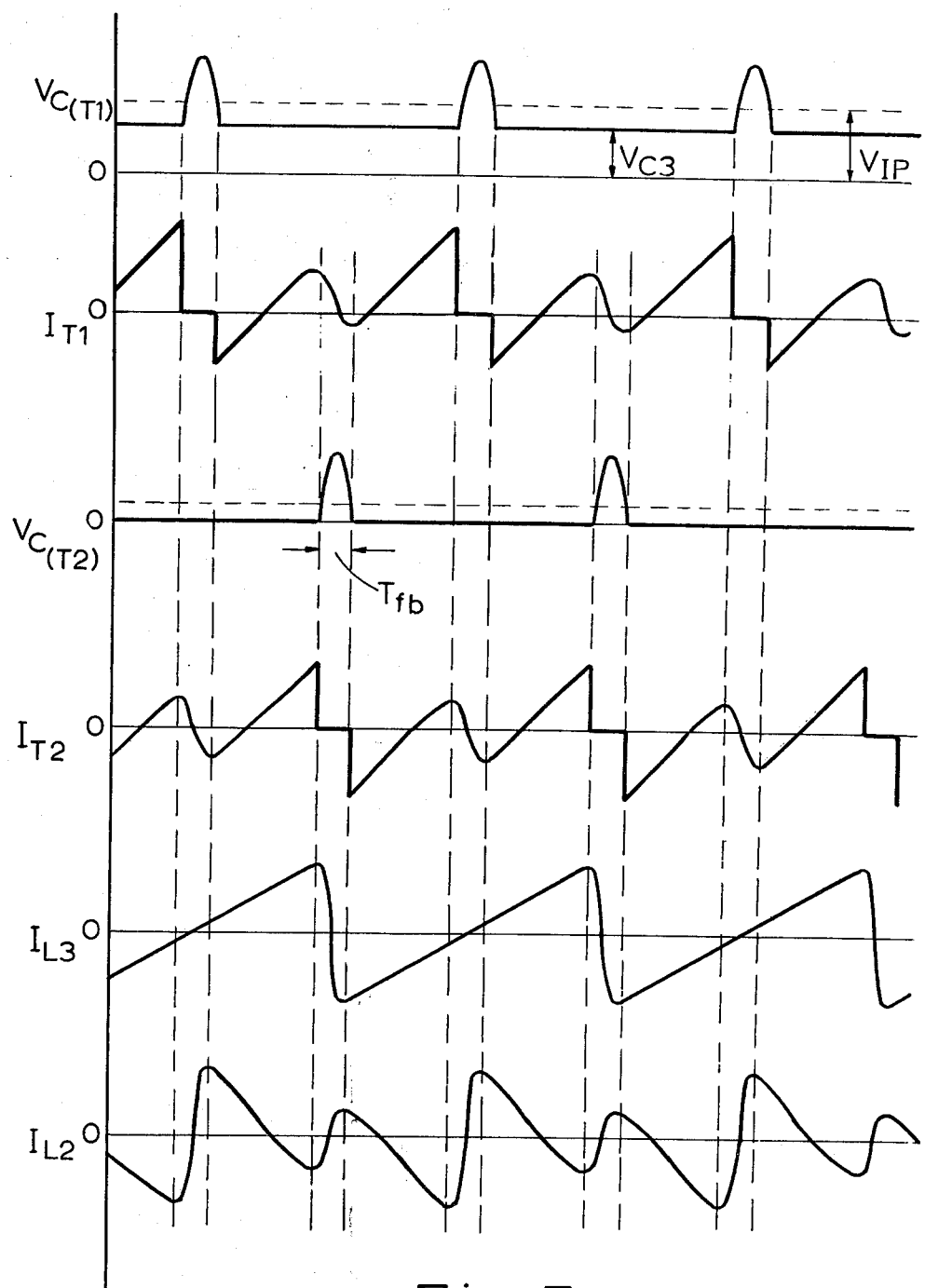
FIG. 5 shows current and voltage waveforms in the circuit arrangement shown in FIG. 1 when operating under a third set of conditions.

When the inductors L1 and L2 are loosely coupled it is also possible to switch transistors T1 and T2 off at different times. The waveforms shown in FIG. 5 illustrate this condition. As will be seen from these waveforms the current through inductor L2 ($I_{L2}$) modifies the current required from the transistor T2 ($I_{T2}$) during part of the scan period. It is not necessary for the collector circuit of transistor T1 to be tuned to the flyback period and it may be longer to provide a pulse of lower peak voltage while giving the required charge for capacitor C3.

The circuit shown in FIG. 1 has the disadvantage that if either of transistors T1 and T2 should fail by going short circuit between emitter and collector, (which is the most usual failure mode), then the other transistor will have the supply voltage at terminals 1 and 2 impressed on it and this could cause a failure in it. Further if transistor T1 should fail in this way capacitor C3, which will then be charged to the full employed potential may supply power to other parts of the receiver and hence these may also be damaged. Any other voltage derived from the deflection stage, e.g. by rectification during the scan period of the waveform appearing across a further winding coupled to inductor L2, will also have its voltage increased with such a failure condition. In order to prevent these failure modes protection circuitry, which may be of conventional design, should be added to this circuit, e.g. by removing the drive from the base of the undamaged transistor.

Figure 6:
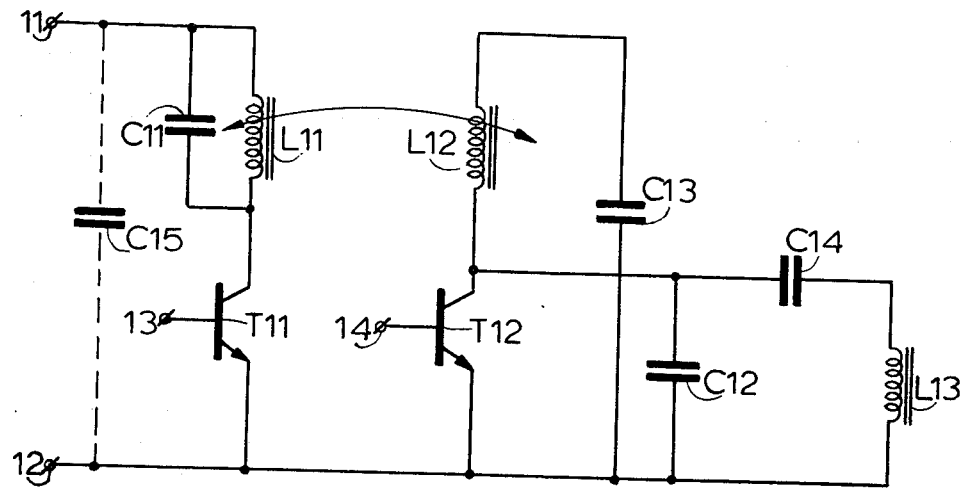
FIG. 6 shows a second embodiment of a circuit arrangement according to the invention.

A modification of the circuit shown in FIG. 1 which does not cause such consequential failure is shown in FIG. 6. In this circuit the parallel combination of an inductor L11 and a capacitor C11 is connected in series with the collector-emitter path of a n.p.n. transistor T11 between terminals 11 and 12, the base of transistor T11 being connected to terminal 13. A capacitor C13 is connected in parallel with the series arrangement of an inductor L12 and the collector-emitter path of an n.p.n. transistor T12, the emitter of transistor T12 being connected to terminal 12. The junction of the collector of transistor T12 and inductor L12 is connected to one end of a capacitor C12, whose other end is connected to the emitter of transistor T12, and a capacitor C14 whose other end is connected to one end of a deflection coil L13. The other end of the deflection coil L13 is connected to the emitter of transistor T12 whose base is connected to terminal 14. The link between the emitters of transistors T11 and T12 may be omitted so that there is no direct connection between the terminals 11 and 12 and the deflection stage.

In operation rectified and smoothed mains voltage is applied to terminals 11 and 12 and transistor T11 is switched in the same manner as with FIG. 1 by pulses applied through terminal 13 to the base of transistor T11 at line frequency. Inductors L11 and L12 are inductively coupled and the current flowing in inductor L11 induces a current in inductor L12 which causes capacitor C13 to be charged to a potential which depends on the width of the voltage pulse across inductor L11, the inductance of inductor L11 the extent of the coupling between inductors L11 and L12, the turns ratio between the inductors, and the relative phase between switch off of transistors T11 and T12. Transistor T12 is the line output transistor and is switched off and on during the line period by pulses applied through terminal 14 to its base in the same manner as with FIG. 1. During the line scan period a sawtooth current flows through the deflection coil L13. If during the line scan period transistor T11 is switched on then the current flowing in inductor L11 induces a corresponding current in inductor L12. If the windings of inductors L11 and L12 are connected in the correct sense it can be arranged that the induced current in inductor L12 aids transistor T12 in supplying the deflection current for deflection coil L13 thus reducing the current required from transistor T12.

Figure 8:
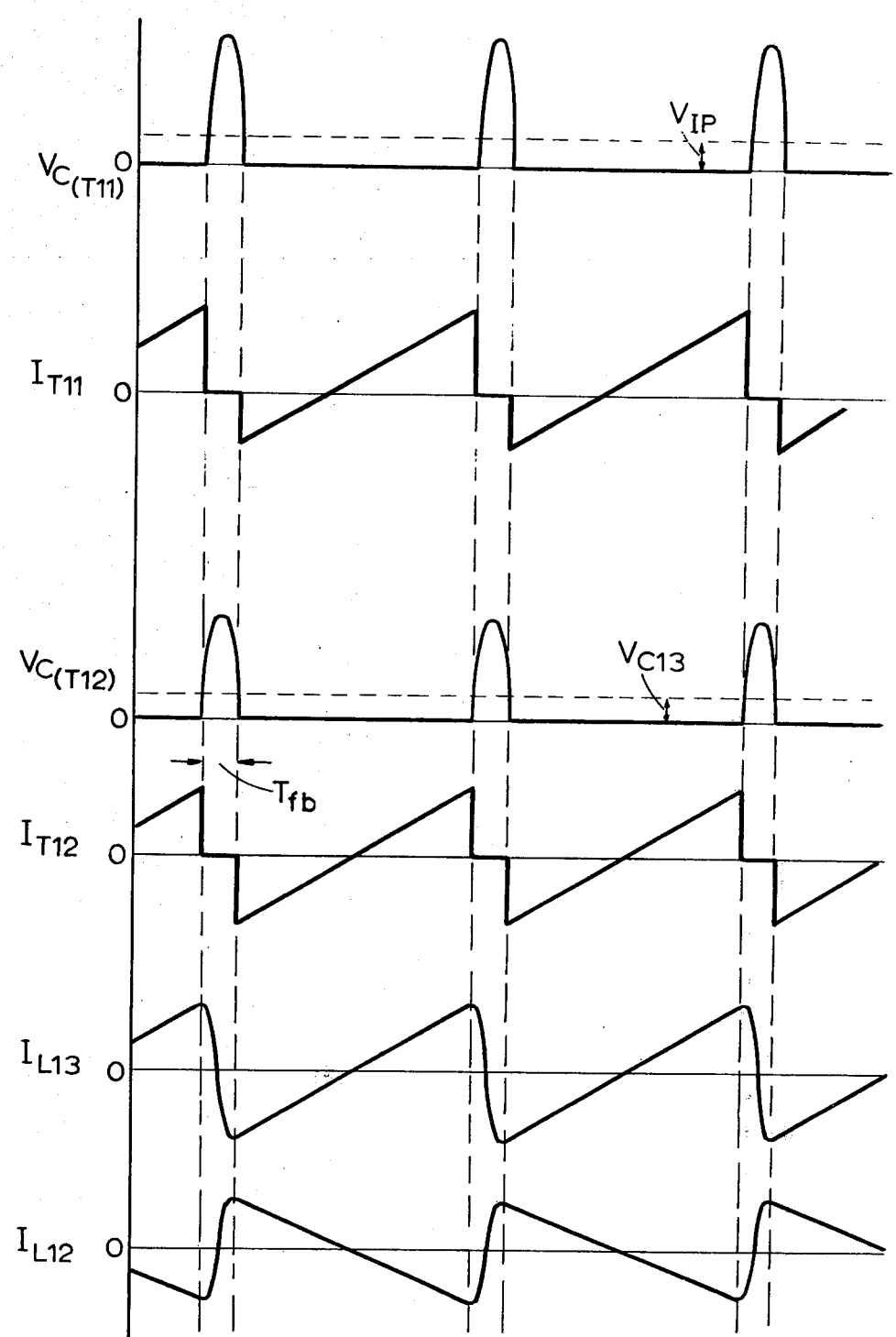
FIG. 8 shows current and voltage waveforms in the circuit arrangement shown in FIG. 6 when operating under a first set of conditions.
Figure 9:
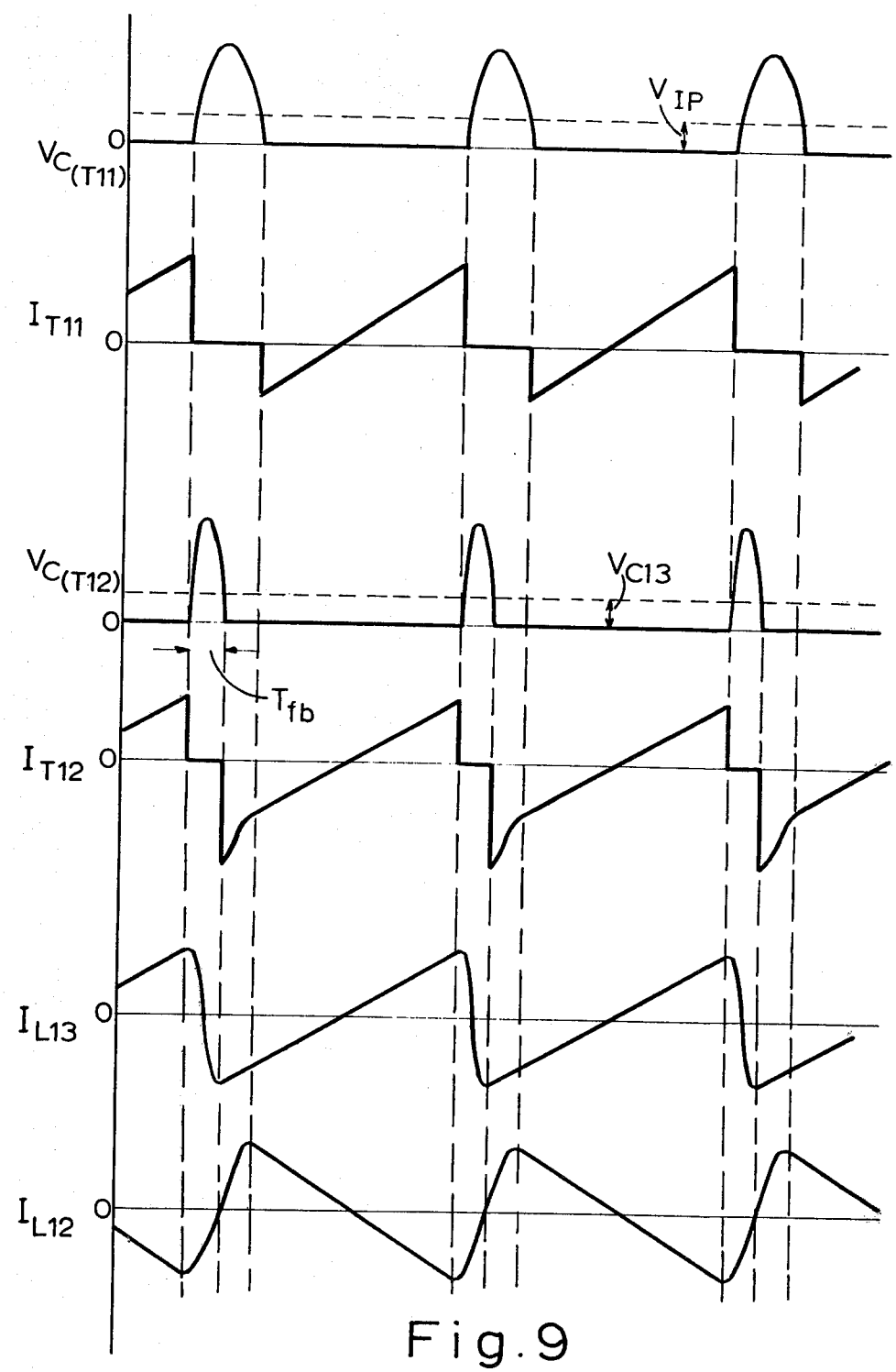
FIG. 9 shows current and voltage waveforms in the circuit arrangement shown in FIG. 6 when operating under a second set of conditions.
Figure 10:
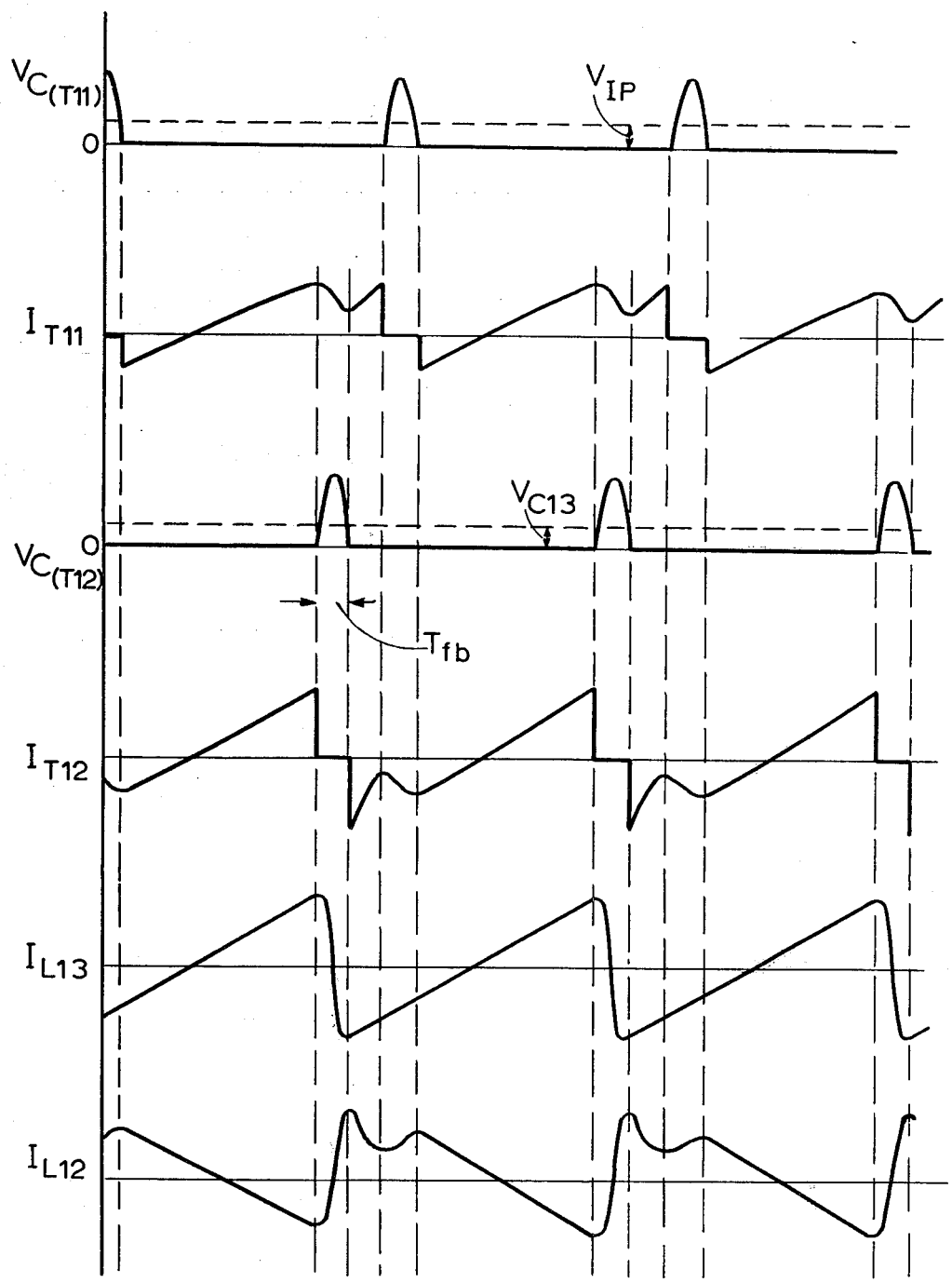
FIG. 10 shows current and voltage waveforms in the circuit arrangement shown in FIG. 6 when operating under a third set of conditions.

The waveforms shown in FIGS. 8, 9 and 10 show the currents $I_{T11}$ and $I_{T12}$ through transistors T11 and T12, the currents $I_{L12}$ and $I_{L13}$ through inductor L12 and deflection coil L13, and the voltages $V_{C(T11)}$ and $V_{C(T12)}$ at the collectors of transistors T11 and T12. FIG. 8 shows the case when the collector circuit of transistor T11 is tuned to the same frequency as the collector circuit of transistor T12 and transistors T11 and T12 are switched off at the same time, in which case inductors L11 and L12 are tightly coupled. FIG. 9 shows the case where the collector circuit of transistor T11 is tuned to a different frequency from the collector circuit of transistor T12 and in this case the inductors must be loosely coupled. FIG. 10 shows the case where transistors T11 and T12 are switched at different times and loose coupling between the inductors L11 and L12 must be used.

This circuit may be used, with the correct dimensioning of coupling and turns ratio between inductors L11 and L12 when battery operation of a television set is used. In this case the battery voltage is applied to terminals 11 and 12 and the coupling and turns ratio between inductors L11 and L12 is such that capacitor C13 is charged to a higher voltage than the battery voltage. Further when used as a battery/mains receiver the battery may be disconnected from terminals 11 and/or 12 during mains operation and a direct supply derived from the mains supply connected to the junction of inductor L12 and capacitor C13.

When used in this manner the circuit will with the addition of a capacitor C15 connected between terminals 11 and 12, produce a low voltage output at terminals 11 and 12 which may be used as the power supply for other parts of the receiver. Capacitor C15 performed the same function when a direct voltage is applied to the junction of capacitor C13 and inductor L12 as capacitor C13 performs when the direct voltage is applied at terminals 11 and 12, i.e. it stores a charge produced by the current through inductor L11. Further, the battery need not be disconnected and the low voltage output will charge the battery. In this case the connection between the emitters of transistors would normally be omitted and would have to be omitted if, as is sometimes the case, the deflection stage is not connected to the receiver chassis but attains some other standing voltage.

In this embodiment the switched mode power supply is formed by transistor T11, capacitor C11, inductor L11, inductor L12 and capacitor C13, the output being available across capacitor C13. In this arrangement the capacitor C13 instead of being directly charged by the current flowing through inductor L11 is charged by the current induced in inductor L12 by the current flowing in inductor L11. When the link between transistors T11 and T12 is omitted the switched mode power supply will produce a mains isolated output across capacitor C13 provided that the inductors L11 and L12 are sufficiently separated physically to maintain mains isolation. This condition will be met if, when the inductors are loosely coupled inductively, they are wound on opposite limbs of the line output transformer.

A further possible modification of the circuit shown in FIG. 6 is that capacitor C13 may be connected to terminal 11 instead of the emitter of transistor T12.

Figure 11:
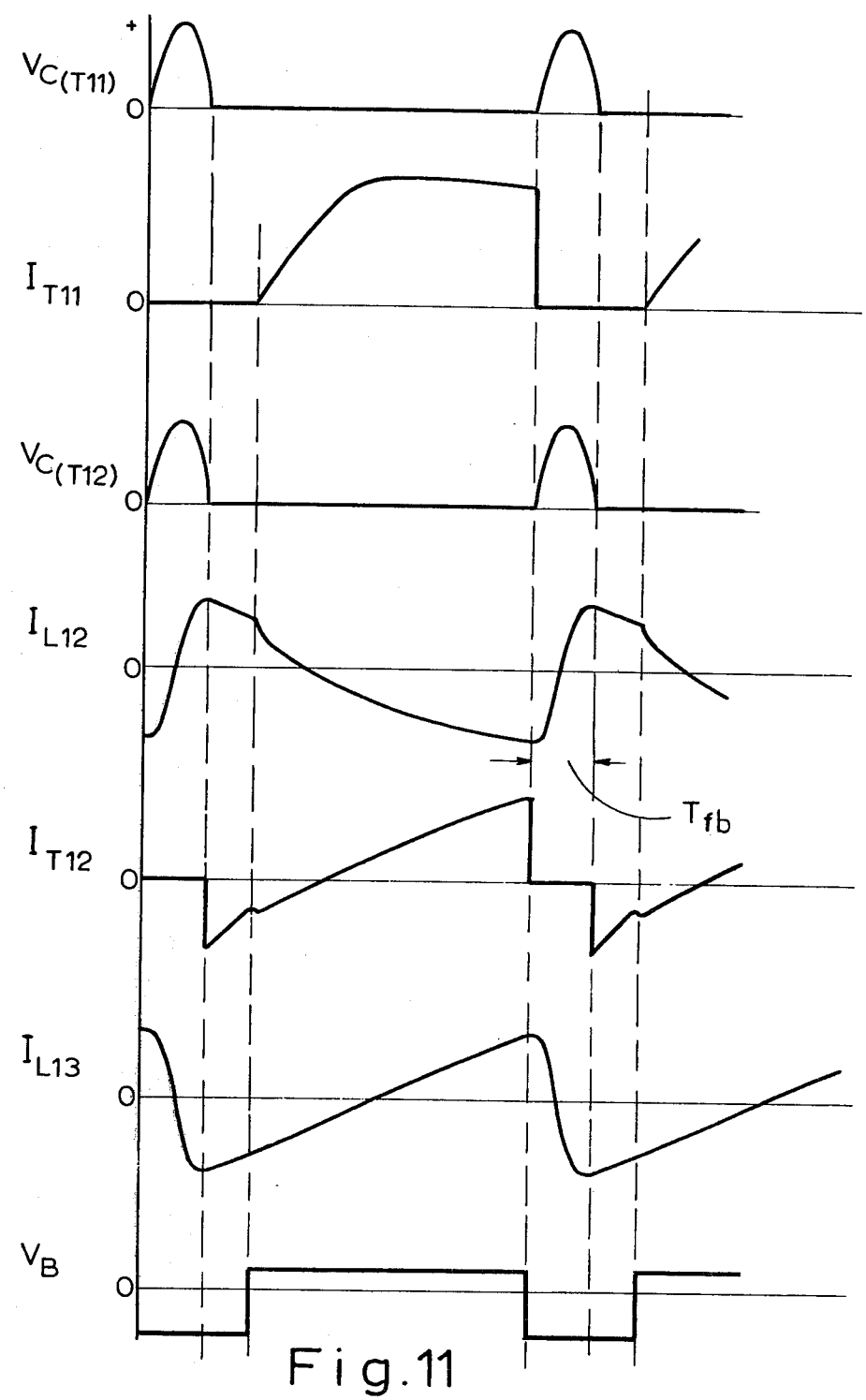
FIG. 11 shows current and voltage waveforms in the circuit arrangement shown in FIG. 6 when operating under a fourth set of conditions.

When inductors L11 and L12 are tightly coupled it is possible to omit capacitor C11 and use the reflection impedance of inductor L12, capacitor C12 and deflection coil L13 to the tune inductor L11. The waveforms produced under these conditions are shown in FIG. 11. The waveform $V_B$ shows the drive waveform to the bases of transistors T11 and T12. It should be noted that as the inductors L11 and L12 are tightly coupled it is essential to switch transistors T11 and T12 at the same time and the drive circuitry to their bases must include means for equalising the switching delays between these transistors. Similar circuitry to that described with reference to FIG. 12 may be used for this purpose. The other waveforms shown in FIG. 11 correspond to the ideal waveforms shown in FIG. 8.

Figure 7:
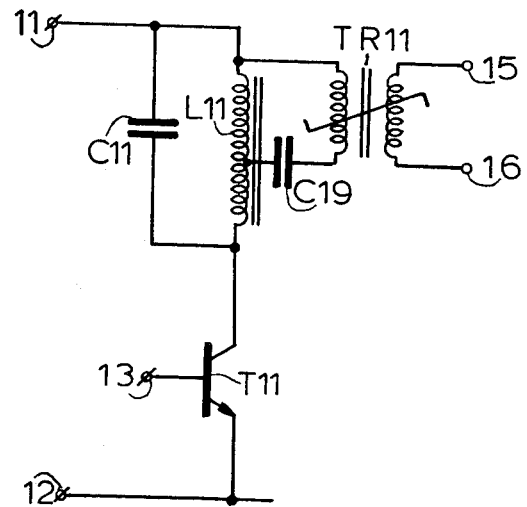
FIG. 7 shows a modification of part of the circuit arrangement shown in FIG. 6.

As shown in FIG. 7 a transducer TR11 may be connected in parallel with inductor L11, the transductor being controlled by a signal, applied at terminals 15 and 16, proportional to the voltage to which the capacitor C13 is charged. This will enable stabilisation of the supply voltage to the deflection stage in a similar manner to that described with reference to FIGS. 1 and 2. With this circuit it is of course necessary to have inductors L11 and L12 loosely coupled. Provided that the control and secondary windings of the transductor are sufficiently separated it is possible to maintain mains isolation of the line deflection stage and the output of the switched mode power supply.

Figure 12:
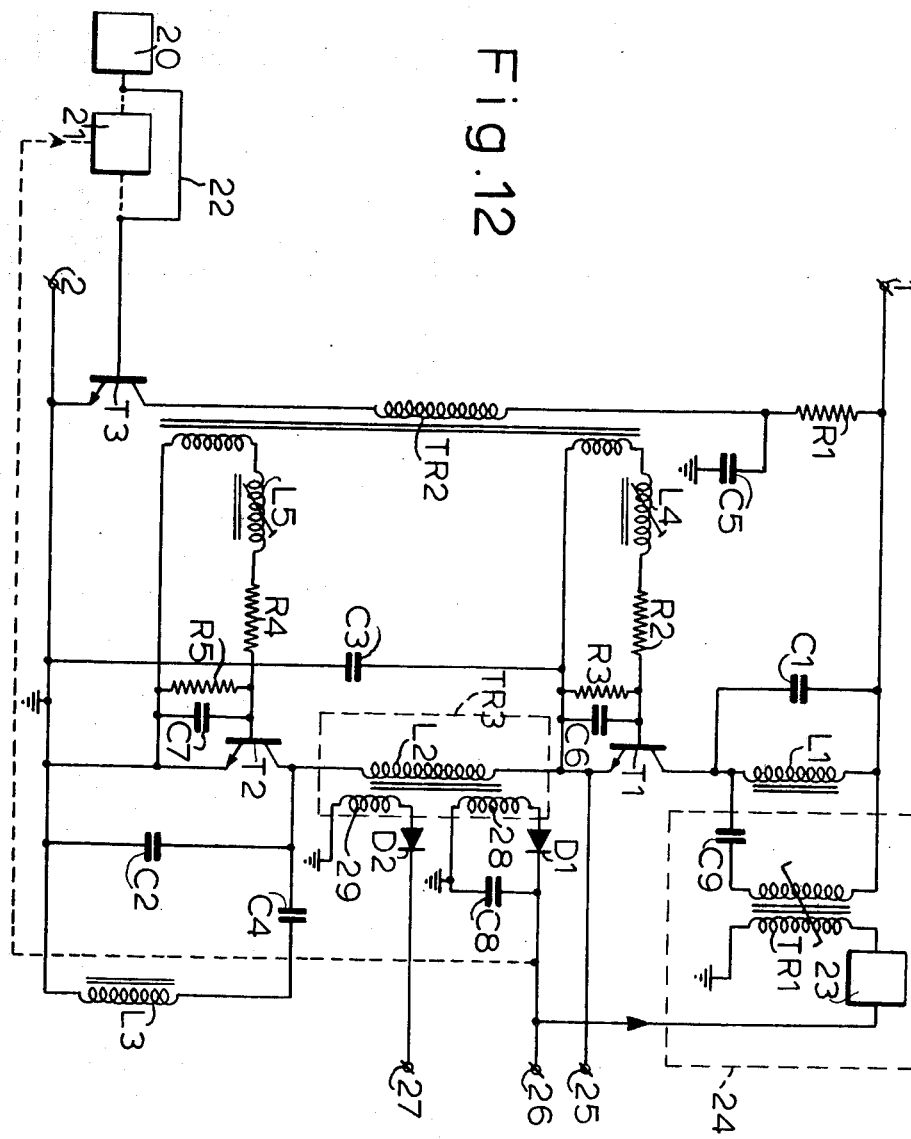
FIG. 12 shows drive and stabilisation circuitry applied to the circuit arrangement shown in FIG. 1.

FIG. 12 shows suitable drive circuitry for the circuit shown in FIG. 1 together with means for deriving auxiliary supply voltages from windings coupled to the second inductor of FIG. 1. Components fulfilling the same functions as those in FIG. 1 have been given the same references.

As with the circuit of FIG. 1 rectified and smoothed mains voltage is applied to terminals 1 and 2. A resistor R1, the primary winding of a transformer TR2 and the collector-emitter path of an n.p.n. transistor T3 are connected in series between terminals 1 and 2. A switching waveform at line frequency is generated in an oscillator 20 and applied to the base of transistor T3. This switching waveform is then applied to the bases of transistors T1 and T2 via separate secondary windings of transformer TR2. These waveforms may be arranged to be in phase or in anti-phase depending on the winding sense of the two secondary windings. If the signals are in-phase the circuit will operate under conditions as illustrated in the waveforms shown in FIGS. 3 or 4 whereas if the signals are in anti-phase then the waveforms will be as illustrated in FIG. 5.

Figure 13:
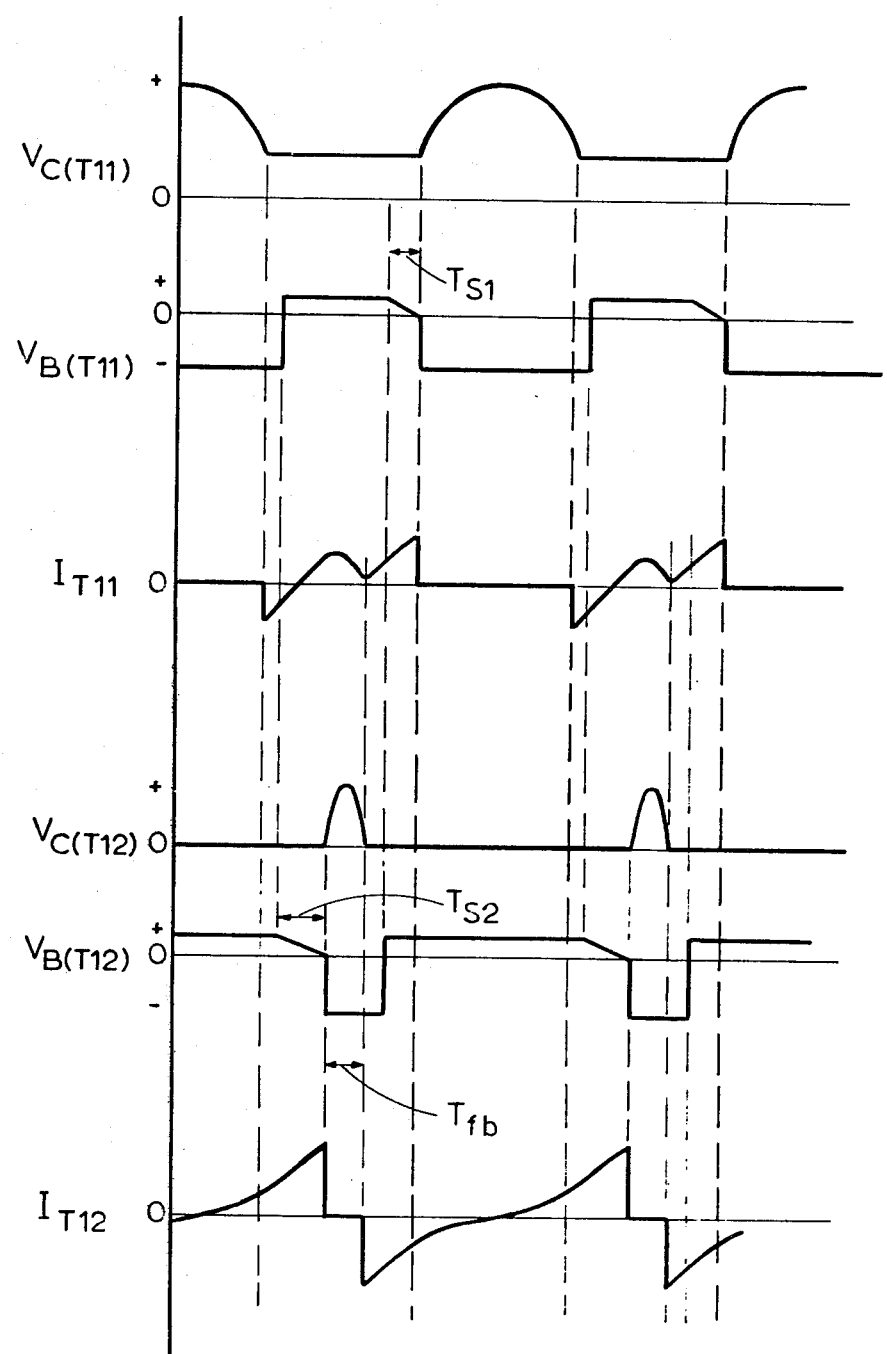
FIG. 13 shows current and voltage waveforms occurring in the circuit arrangement shown in FIG. 12.

When inductors L1 and L2 are closely coupled it is essential that transistors T1 and T2 are switched on and off at the same time and in order to equalise the switching delays in the devices an inductor is included between each secondary winding of the transformer TR2 and the base of the respective transistor. These switching delays are caused by hole storage in transistors T1 and T2 and are shown in FIG. 13 as times $T_{S1}$ and $T_{S2}$.

These inductors L4 and L5 are preferably variable so that they can be conveniently adjusted to compensate for different device characteristics. Conveniently the inductors may be wound on a single former and a ferrite core adjuster fitted so that adjustment of the core will increase the value of one inductor and simultaneously decrease the value of the other.

The line output transformer TR3 of which inductor L2 forms one winding and inductor L1 may form a further winding is provided with two further windings 28 and 29. The voltage appearing across winding 28 is rectified by diode D1 and during the scan period charges capacitor C8 to provide a source of direct voltage at a low potential for other parts of the receiver which is presented at terminal 26. Winding 29 also has a voltage induced in it which serves as a source of E.H.T. which may be either rectified by a diode D2 or applied to a voltage multiplier circuit to increase its value if required. Terminal 25 is connected to the junction of the emitter of transistor T1 and capacitor C3 so that the voltage appearing across capacitor C3 is available to act as a direct voltage source for other parts of the receiver.

In order to stabilise the direct voltages generated in the circuit one of them may be used to control transductor TR1 to cause the tuning of the collector circuit of transistor T1 to be varied. As shown in FIG. 12 the rectified and smoothed output from winding 28 is applied to a sensing and control circuit 23 which compares the voltage at terminal 26 with a reference potential and produces a control current dependent on the difference between these voltages and applies it to the control winding of transductor TR1. This changes the effective inductance of the secondary winding of transductor TR1 thus changing the tuning of the collector circuit of transistor T1. It would, of course, be possible to take any other of the voltages generated in this circuit and apply them to the sensing and control circuit 23. When using transductor TR1 for stabilising the voltage the oscillator 20 is connected to the base of transistor T3 via line 22. An alternative method of stabilising the voltages produced by this circuit is to dispense with the components within block 24 and to feed a generated voltage to a sensing and control circuit 21. This circuit is connected between the output of oscillator 20 and the base of transistor T3, link 22 being omitted. Sensing and control circuit 21 senses the voltage at terminal 26 and causes the mark/space ratio of the square wave output from oscillator 20 to be varied so that the time of switching transistor T1 is varied with respect to the time of switching transistor T2. The waveforms then occurring in the circuit are shown in FIG. 13.

FIG. 13 shows the waveforms at the bases of transistors T1 and T2 at $V_{B(T1)}$ and $V_{B(T2)}$ respectively. The secondary windings of transformer TR2 are arranged so that anti-phase pulses are applied to the bases of transistors T1 and T2. The instant at which transistor T1 is switched off and hence transistor T2 switched on may vary between the end of the flyback period to the instant that the scan current reverses in polarity. Neither transistor should be switched on before its half sine wave of oscillation is completed. This means that when transistors T1 and T2 are switched from the same waveform source transistor T1 must be switched on at some time between the end of its half sine wave period and the time when the current in transistor T1 reverses giving a limit to the extent of stabilisation that may be achieved by this method. It can be seen from the waveforms in FIGS. 5 and 10 that transistors T1 and T11 are not switched off until after the scan current in transistors T2 and T12 has reversed. In this case transistors T1 and T2 or transistors T11 and T12 must be switched from different sources.

Figure 14:
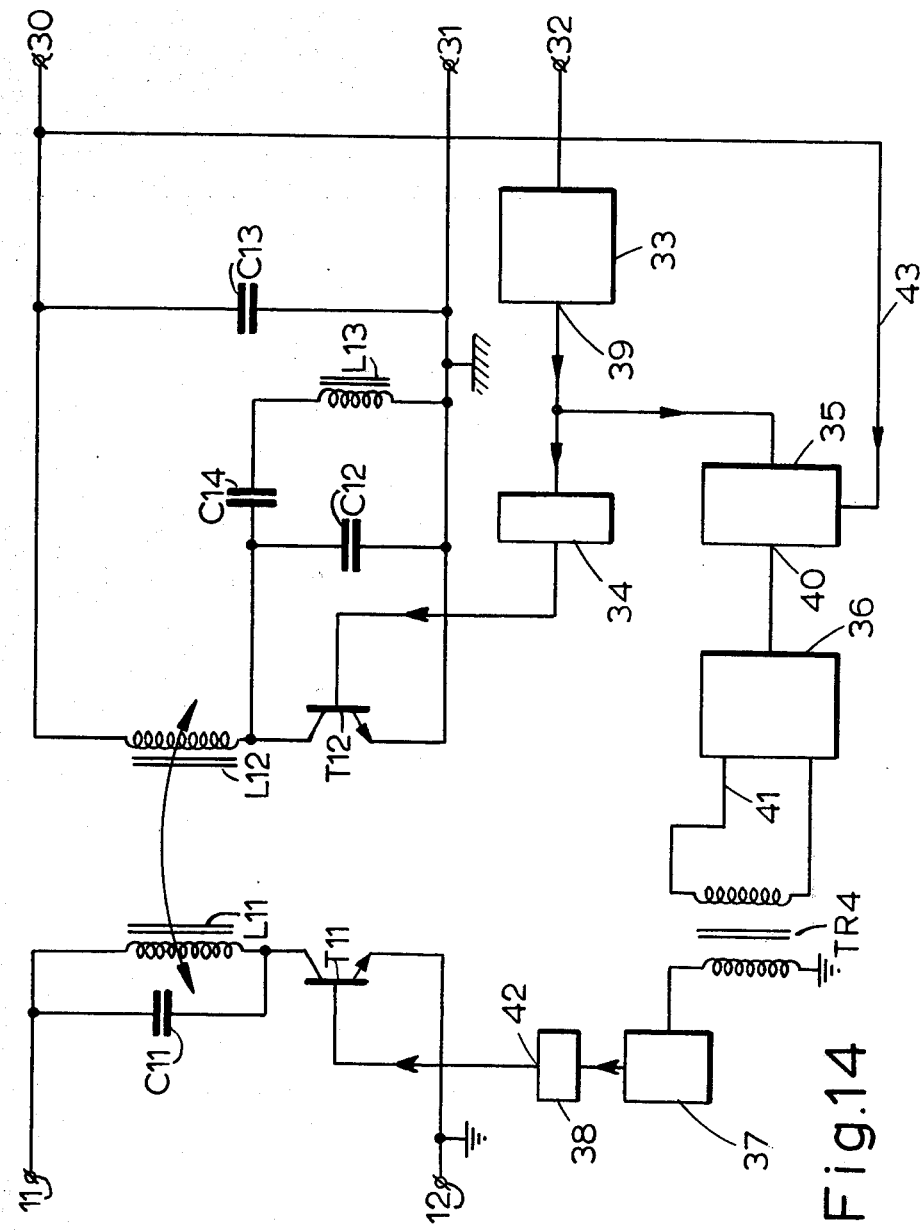
FIG. 14 shows drive and stabilisation circuitry applied to the circuit arrangement shown in FIG. 6.

FIG. 14 shows the circuit of FIG. 6 together with suitable drive circuitry and illustrates an embodiment having a mains isolated line deflection stage. Components fulfilling the same functions as those in FIG. 6 have been given the same references.

Figure 15:
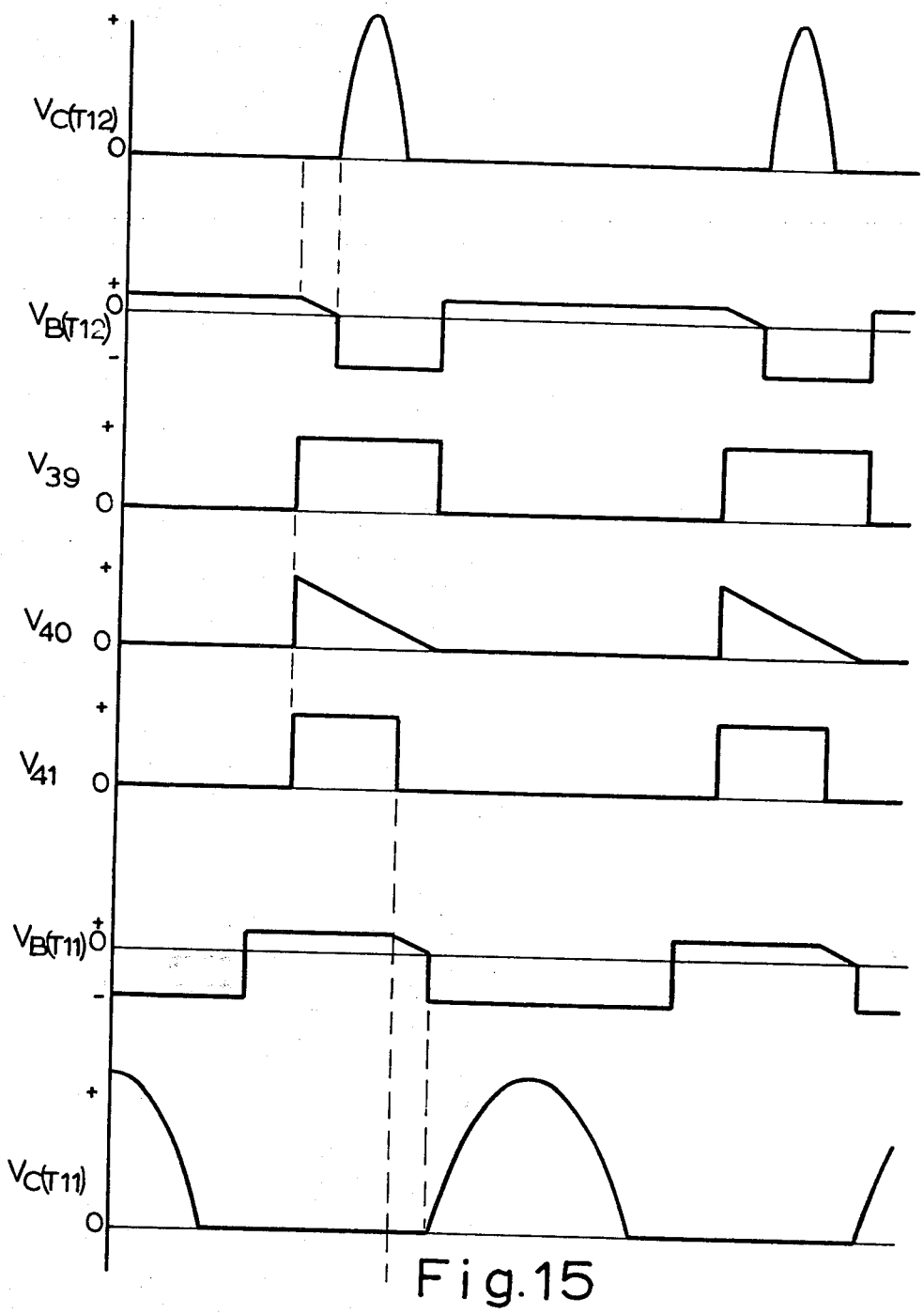
FIG. 15 shows voltage waveforms occurring in the circuit arrangement shown in FIG. 14.

As with the circuit of FIG. 6 rectified and smoothed mains voltage is applied to terminals 11 and 12. Synchronising signals applied via terminal 32 control a pulse generator circuit 33 which generates a switching waveform at line frequency. This waveform is shown in FIG. 15 as waveform V39, i.e. the waveform at output 39 of the pulse generator circuit 33. This waveform is applied via a driver circuit 34 to the base of transistor T12 as waveform $V_{BT12}$. The waveform V39 is also applied to a ramp generator 35 which produces at its output 40 the waveform shown in FIG. 15 as V40. The ramp waveform V40 is applied to a voltage level sensing circuit 36 which produces an output waveform V41 in the form of a pulse having a variable pulse width. Thus the ramp generator 35 and voltage level sensing circuit 36 form a pulse width modulator. The pulse width of the output from the pulse width modulator is controlled by the potential across the capacitor C13 or a potential derived therefrom or from a potential which may be derived from a further winding of the line output transformer (of which inductors L11 and L12 form part) in similar manner to that shown in FIG. 12. The pulse waveform V41 is applied via a transformer TR4 to the trigger input of a pulse generator 37. The pulse generator 37 produces a pulse having a constant pulse width and having its leading edge substantially co-incident with the negative going edge of the waveform V41. This pulse is then applied to the base of transistor T11 through a driver stage 38 as waveform $V_{BT11}$.

Inductors L11 and L12 are loosely inductively coupled and are preferably wound on opposite limbs of the line output transformer. As described with reference to FIG. 12 further windings may be provided on the line output transformer and the voltages induced therein rectified and used to power other stages of say a television receiver. These further windings are preferably wound on the same limb of the line output transformer as inductor L12 so that the core of the transformer provides sufficient isolation between the inductor L11 and these windings without the necessity for earthed screens between the windings. Thus it can be arranged that the only parts of the receiver not mains isolated are the mains rectifier and smoothing circuits, inductor L11, capacitor C11, transistor T11, driver stage 38, pulse generator 37 and the secondary winding of transformer TR4.

In order to stabilise the voltage across capacitor C13 the time at which transistor T11 is switched relative to that of transistor T12 is varied. The time of switching of transistor T11 is controlled by the pulse width modulator. The voltage level sensing circuit 36 may consist, for example, of a Schmitt Trigger circuit whose output switches from a first level to a second level when its input is fed with a voltage having a given value. The ramp generator 35 produces a waveform having a step leading edge and a relatively slowly descending ramp from the switching waveform produced by pulse generator 33. The amplitude of the ramp voltage is dependent on the supply voltage to the ramp generator 35 and if this is derived from the voltage across capacitor C13 or from a voltage derived from another winding on the line output transformer it will be related to the voltage across capacitor C13. As the front of the ramp waveform is steep the time at which the voltage level sensing circuit 36 switches on the front edge will not markedly vary with varying ramp amplitudes. However, the descending ramp is not as steep and the time at which the voltage level sensing circuit 36 switches will vary with varying ramp amplitudes as it is designed to switch at a given amplitude. Thus the width of the pulse produced by the pulse width modulator is dependent on the voltage across capacitor C13 applied to the ramp generator section 35 thereof. The output (V41) from the pulse width modulator is applied via transformer TR4 to the trigger input of the pulse generator 37. The transformer TR4 is provided to maintain mains isolation of the line deflection circuit. The pulse generator 37, which may be formed for example as a monostable multivibrator, produces a pulse having a fixed pulse width but whose leading edge is co-incident with the negative going edge of the waveform V41, neglecting switching delays. The waveform $V_{BT11}$ illustrates the waveform produced at the output of the pulse generator 37 after it has passed through the driver circuit 38 in which it is inverted. The arrows on waveform V41 indicate the edge which varies with varying ramp amplitude and those on waveform $V_{BT11}$ show the corresponding variation of the time of the pulse produced by pulse generator 37. It should be noted that the pulse has a constant width, both edges being shifted by the same time. It can be seen that both transistors T11 and T12 switch off after a short delay after the switching waveform at their base electrode starts to go negative. This is due to hole storage in the base-emitter region of the transistors.

Figure 16:
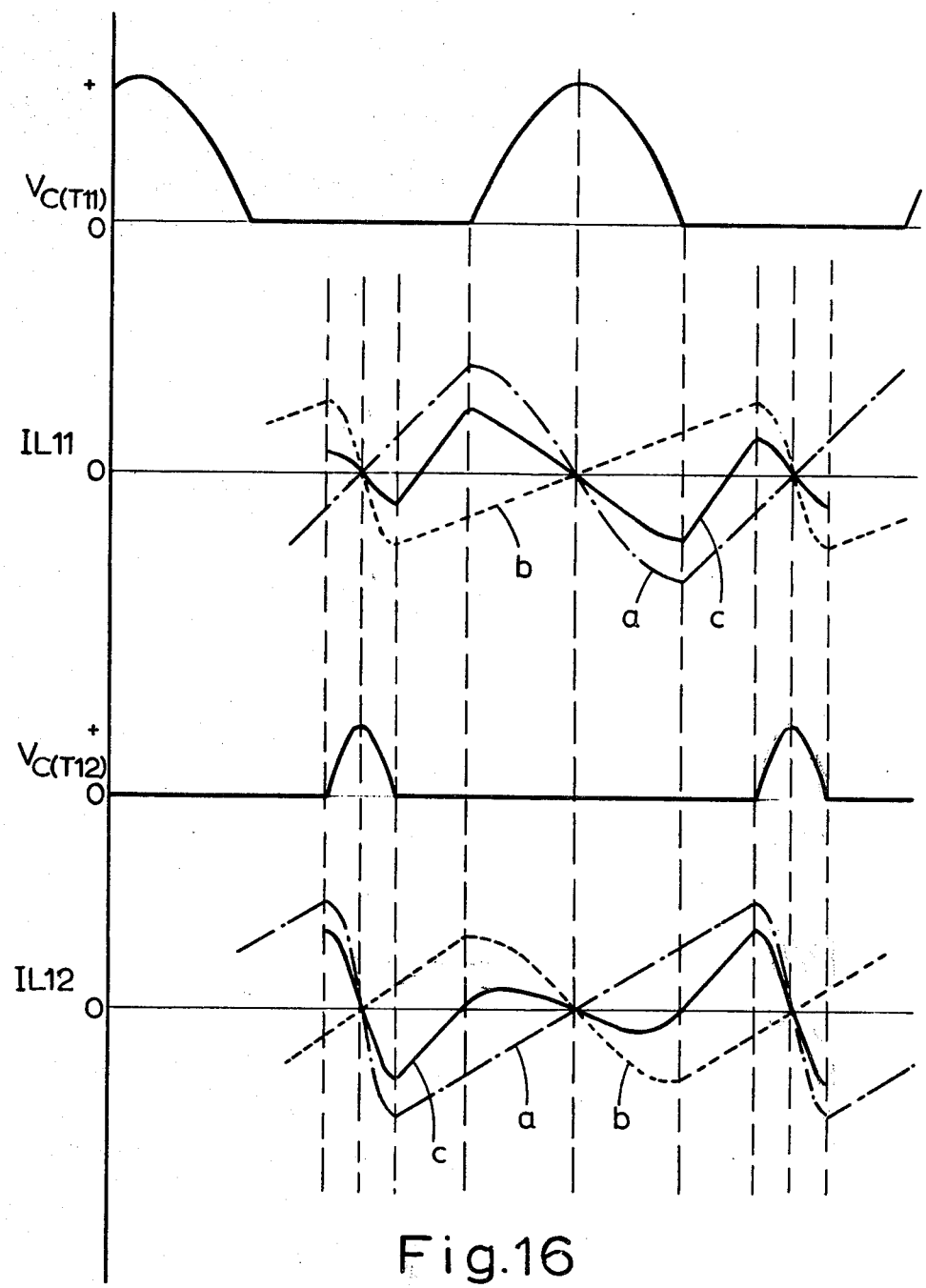
FIG. 16 shows voltage and current waveforms occurring in the circuit arrangement shown in FIG. 14 under a first set of conditions.
Figure 17:
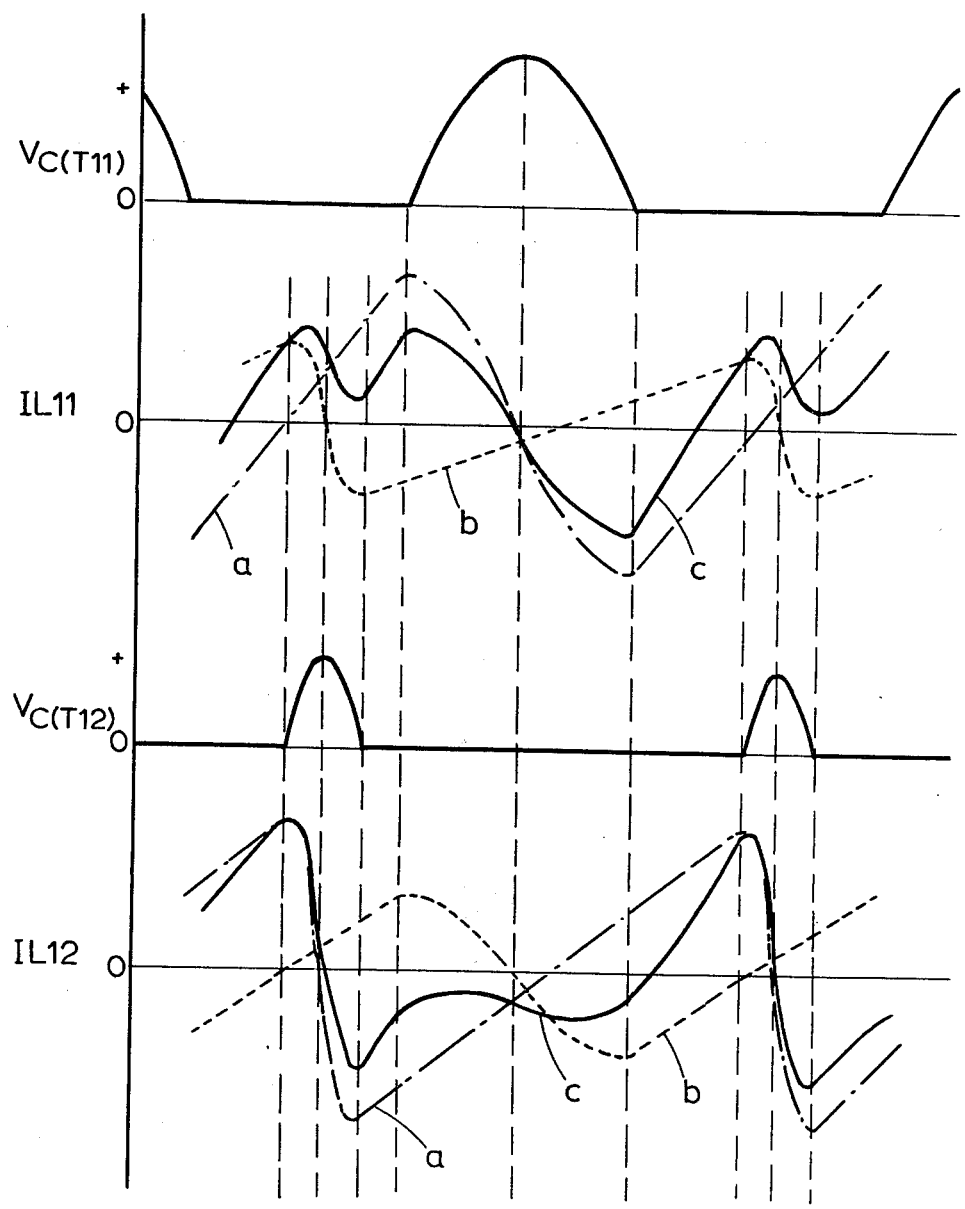
FIG. 17 shows voltage and current waveforms occurring in the circuit arrangement shown in FIG. 14 under a second set of conditions.
Figure 18:
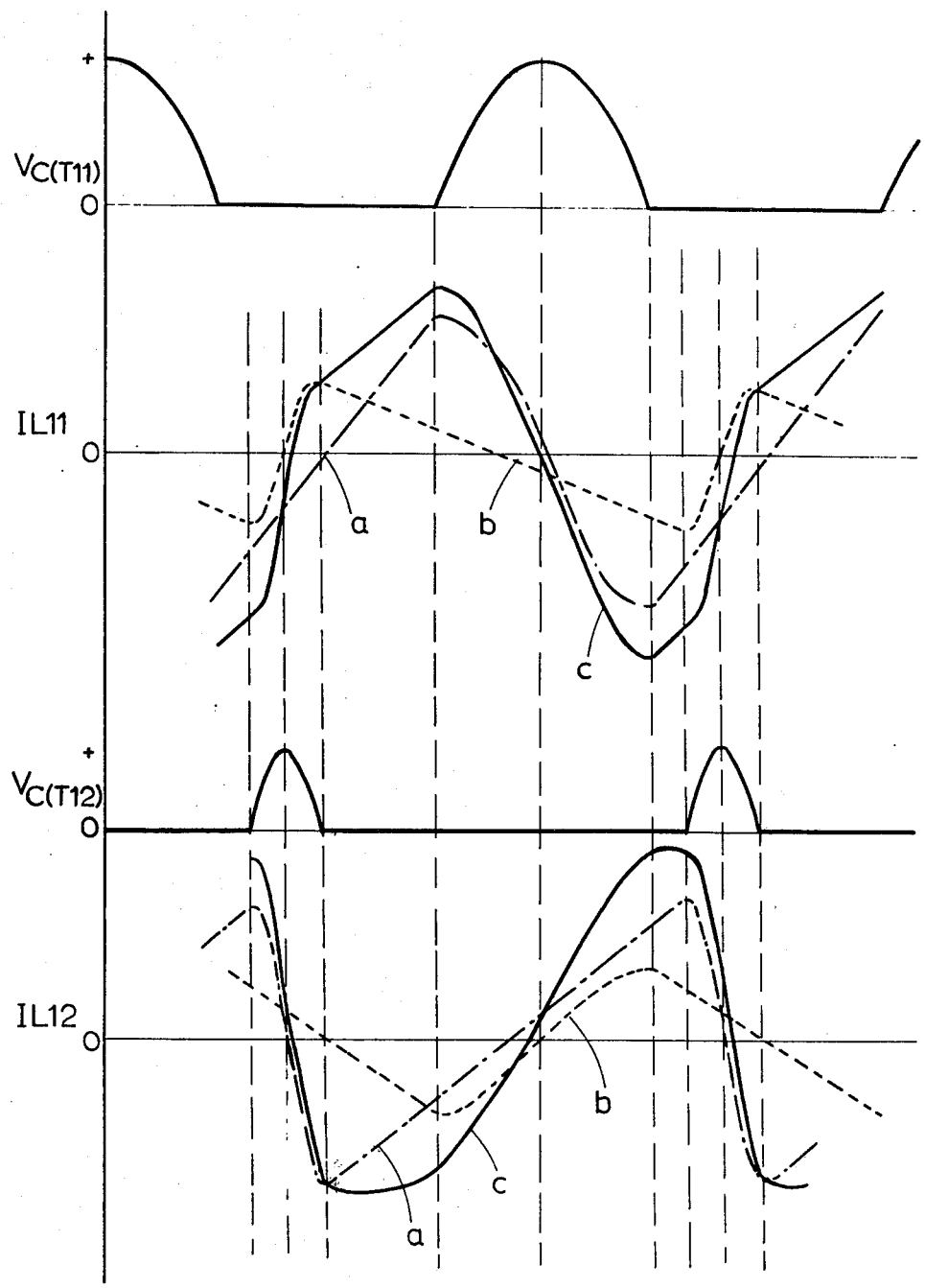
FIG. 18 shows voltage and current waveforms occurring in the circuit arrangement shown in FIG. 14 under a third set of conditions.

FIGS. 16, 17 and 18 show waveforms illustrating the current flow through inductors L11 and L12 when transistor T11 is switched at the centre of the line scan period, before the centre of the line scan period, and after the centre of the line scan period respectively. In these figures curve *a* shows the current flowing through the inductor due to the switching of the transistor connected in series therewith, curve *b* shows the current induced in the inductor due to the current flowing in the other inductor and curve *c* shows the total current flowing through the inductor being the sum of *a* and *b*.

As can be seen from the curves for inductor L12 in FIG. 16 when the transistor T11 is switched so that the centre of the voltage pulse produced across inductor L11 is at the centre of the line scan period the current induced in inductor L12 due to the current flowing in inductor L11, i.e. curve *b*, is symmetrical about the zero current line over one scanning cycle. Further the total current, i.e. curve *c* flowing in inductor L12 is symmetrical about the zero current line over one scanning cycle. This means there can be no total energy flow from inductor L11 to inductor L12 during a complete line scanning cycle. Thus capacitor C13 will not be charged and thus no power for the line deflection stage can be generated in this way. It can also be seen from the curve for inductor L11 in FIG. 16 that the current induced in inductor L11 by current flowing in inductor L12 and the total current, i.e. curve *c*, are symmetrical about the zero current line over one scanning cycle. Thus there will also be no total energy flow from inductor L12 to inductor L11 during a complete line scanning cycle and therefore FIG. 16 shows imaginary waveform for a condition which can never occur in practice.

FIG. 17 illustrates the currents flowing in inductors L11 and L12 when transistor T11 is switched so that the centre of the voltage pulse across inductor L11 is before the centre of the scan period. In this case the total current waveform curve *c* is not symmetrical about the zero current axis during a line scanning cycle and therefore an energy flow may be produced between inductors L11 and L12. This energy transfer from inductor L11 to inductor L12 can be used to charge the capacitor C13. The total energy transferred depends on the amount of coupling between the inductors and on the relative time of switching transistors T11 and T12 off. The amount of energy transferred will increase as the time of switching transistor T11 approaches the time of switching transistor T12. Thus by varying the time of switching transistor T11 the amount of energy transfer and therefore the voltage to which capacitor C13 is charged may be controlled.

FIG. 18 illustrates the currents flowing in inductors L11 and L12 when transistor T11 is switched so that the centre of the voltage pulse across inductor L11 is after the centre of the scan period. Again the total current waveform, curve *c*, is not symmetrical about the zero current axis during a line scanning cycle and a net energy flow between inductors L11 and L12 is produced. The winding direction for inductor C11 for FIG. 18 is is reversed with respect to that for FIG. 17, otherwise the charge on the capacitor C13 would be reduced. The charge across capacitor C13 will increase as the switching time of transistor T11 is made later in the line scanning cycle.

The circuit arrangement shown in FIG. 14 has the advantage over that shown in FIG. 12 that if either of transistors T11 or T12 fails by going short circuit between collector and emitter then the arrangement ceases to function thus protecting the other device. Also by including a transformer in the control circuit to transistor T11 the arrangement can give mains isolation for the line deflection stage and if further d.c. supplies are taken from auxiliary windings on the line output transformer in a similar manner to that shown in FIG. 12 this arrangement can provide an almost totally mains isolated television receiver with only the rectifying and smoothing circuit for the mains supply, transistor T11, pulse generator 37, and driver circuit 38 not being isolated from the mains supply. As inductors L11 and L12 are loosely coupled, e.g. wound on opposite limbs of the core of the line output transformer, the tuning of inductor L11 does not have to be tied to the flyback period. If inductor L11 is tuned to a lower frequency, i.e. a half sinewave pulse across inductor L11 having a period longer than the flyback period, the peak voltage transistor T11 has to withstand between its base and collector electrodes is reduced. This enables a transistor with a lower voltage rating than would otherwise be required to be used as transistor T11.

In the circuit arrangements above described, the transistors T1, T2, T11 and T12 are switched from a first state in which they conduct substantially no current to a second state in which they provide a virtual short circuit in their main current path and therefore they function as switches. It will therefore be realised that the transistors may be readily replaced by other devices having a similar capability to function as switches. Such devices could for instance be thyristors or gate turn off switches though with such devices it may be necessary to provide circuit means for rendering the devices non-conducting. As previously explained, if the devices are not capable of conducting current in both directions during their short circuit periods it may be necessary to provide a diode or other unidirectional current conducting component in parallel with the device.

What is claimed is:

1. A circuit arrangement for supplying current to a line deflection coil from a first source of a direct voltage, said arrangement comprising a switched mode power supply circuit including a first switch, a first inductor coupled in series with said first switch, said switch and inductor being coupled between terminals adapted to be connected to said first source of direct voltage, and a line deflection circuit coupled to said power supply circuit and comprising a second switch, a second inductor series coupled to said second switch, and a capacitor coupled to said first switch, said first switch having a control input means for receiving a first control signal having a television line frequency or a multiple or submultiple thereof whereby charge is produced on said capacitor, said capacitor when charged comprising a second direct voltage supply for said second switch, means for ensuring that during each period when said first switch is non-conducting the voltage at the junction of said first switch and said first inductor has a half sinewave shape at a first frequency comprising said first inductor being tuned to a selected frequency, said second switch having input means for receiving a second control signal having a line frequency whereby current is provided to said line deflection coil during scan periods and to be non-conducting during the flyback periods, and means for ensuring that during each period when said second switch is nonconducting the voltage at the junction of said second switch and said second inductor has a half sinewave shape at a second frequency comprising said second inductor being tuned to a selected frequency.

2. A circuit arrangement as claimed in claim 1, wherein said first switch is switched at line frequency.

3. A circuit arrangement as claimed in claim 1, wherein said first and second inductors are inductively coupled.

4. A circuit arrangement as claimed in claim 3, wherein in operation at least part of the current through the line deflection coil during at least part of the scan period is provided by current flowing through said second inductor and is induced by current flowing through said first inductor.

5. A circuit arrangement as claimed in claim 3, wherein said first and second inductors are tightly coupled.

6. A circuit arrangement as claimed in claim 5, wherein said first inductor is tuned by the reflected impedance of the tuned circuit associated with said second inductor.

7. A circuit arrangement as claimed in claim 1, further comprising a transductor coupled in parallel with said first inductor, and means coupled to said transductor for control thereof by a signal dependent on a first potential derived from said circuit arrangement to stabilize a second potential produced in said circuit arrangement.

8. A circuit arrangement as claimed in claim 7, wherein said first and second potentials have the same value.

9. A circuit arrangement as claimed in claim 1, further comprising means coupled to said first switch for varying the time at which said first switch is switched off relative to that at which said second switch is switched off, said means being controlled by a potential derived from said circuit arrangement.

10. A circuit arrangement as claimed in claim 9, further comprising means for generating a pulse train whose duty cycle ratio is varied under the control of said potential for switching off said switches from alternate edges of said pulse train.

11. A circuit arrangement as claimed in claim 1, wherein said second inductor is coupled between a first pole of said first switch and a second pole of said second switch, said capacitor being coupled between the first poles of said first and second switches.

12. A circuit arrangement as claimed in claim 11, wherein the peak currents in and peak voltages across said first and second switches are substantially equal respectively.

13. A circuit arrangement as claimed in claim 11, wherein said first switch is switched off at the start of the flyback period.

14. A circuit arrangement as claimed in claim 1, wherein said second inductor is coupled between the one pole of said second switch and one end of said capacitor, the other end of said capacitor being coupled to the other pole of said second switch, said inductors being inductively coupled.

15. A circuit arrangement as claimed in claim 14, further comprising means for providing that the voltage to which said capacitor is charged is greater than that of said first source of direct voltage comprising said first and second inductors having selected dimensions.

16. A circuit arrangement as claimed in claim 15, wherein a direct supply voltage is adapted to be coupled to said capacitor and a direct voltage is produced across the series connection of said first inductor and said first switch at said terminals.

17. A circuit arrangement as claimed in claim 14, in which said first source of direct voltage comprises a source of rectified mains voltage, said second inductor being isolated from said source of rectified mains voltage.

18. A circuit arrangement as claimed in claim 17, further comprising a line output transformer having limbs, said first and second inductors being wound on opposite limbs of said line output transformer.

19. A circuit arrangement as claimed in claim 18 further comprising windings disposed on said line output transformer, whereby further direct voltage supplies for said apparatus may be derived.

20. A circuit arrangement as claimed in claim 19, wherein said further windings are disposed on the same limb of said line output transformer as said second inductor, whereby said further direct voltage supplies are isolated from said source of rectified mains.

21. A circuit arrangement as claimed in claim 1, further comprising a first pulse generator means for producing said second control signal at line frequency, said first pulse generator being adapted to be controlled by a synchronizing signal, means for applying said second control signal to said second switch, a pulse width modulator means coupled to receive said second control signal for producing a further signal at line frequency whose pulse width is dependent on a voltage derived from said circuit arrangement, the leading edge of each pulse of said further signal substantially coinciding with that of said second control signal, a second pulse generator means for producing said first control signal at line frequency, means for applying said further signal to said second pulse generator, said first control signal comprising pulses having a substantially constant pulse width, the leading edge of each pulse of said first control signal being substantially co-incident with the trailing edge of the corresponding pulse of said second signal, and means for applying said first control signal to said first switch.

22. A circuit arrangement as claimed in claim 21, wherein said first source of direct voltage comprises a source of rectified mains voltage and said means for applying said further signal to said second pulse generator comprises a transformer, whereby said transformer is effective to maintain isolation between circuits associated with said second inductor and said source of rectified mains voltage.

* * * * *